(12) United States Patent
Pagani

(10) Patent No.: US 10,062,668 B2
(45) Date of Patent: Aug. 28, 2018

(54) SEMICONDUCTOR ELECTRONIC DEVICE WITH IMPROVED TESTING FEATURES AND CORRESPONDING PACKAGING METHOD

(71) Applicant: STMICROELECTRONICS S.R.L., Agrate Brianza (IT)

(72) Inventor: Alberto Pagani, Nova Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/368,159

(22) Filed: Dec. 2, 2016

(65) Prior Publication Data

US 2017/0373040 A1    Dec. 28, 2017

(30) Foreign Application Priority Data

Jun. 28, 2016 (IT) .................. 102016000067073

(51) Int. Cl.
*H01L 23/58* (2006.01)
*H01L 25/065* (2006.01)
(Continued)

(52) U.S. Cl.
CPC .......... *H01L 25/0657* (2013.01); *G01R 31/27* (2013.01); *G01R 31/2884* (2013.01);
(Continued)

(58) Field of Classification Search
CPC . H01L 23/5389; H01L 23/13; H01L 23/5384; H01L 24/19; H01L 24/73
(Continued)

(56) References Cited

U.S. PATENT DOCUMENTS 5,289,077 A    2/1994    Ugajin
6,392,292 B1   5/2002    Morishita
(Continued)

FOREIGN PATENT DOCUMENTS

KR    2011-0028746 A    3/2011
KR    2011-0056469 A    5/2011

OTHER PUBLICATIONS

Franssila, Sami. *Introduction to Microfabrication*. John Wiley & Sons, 2010, pp. 39-40, 125, 212-215.
(Continued)

*Primary Examiner* — Frederick B Hargrove
(74) *Attorney, Agent, or Firm* — Seed IP Law Group LLP

(57) ABSTRACT

An electronic device provided with a package housing a stacked structure formed by dies of semiconductor material, which have a respective integrated circuit and a respective top surface, which extends in a horizontal plane, and are stacked on one another in a vertical direction, transverse to the horizontal plane, and staggered parallel to the same horizontal plane. Provided at a first portion of the top surface is a first plurality of contact pads, and provided at a second portion of the top surface is a second plurality of contact pads. The first portion is covered by a overlying die, and the second portion is exposed and freely accessible. At least some of the contact pads of the first plurality are electrically coupled to internal through silicon vias traversing a substrate of the overlying die to put overlapping dies in electrical contact.

23 Claims, 14 Drawing Sheets

(51) Int. Cl.
*H01L 21/66* (2006.01)
*H01L 25/00* (2006.01)
*G01R 31/28* (2006.01)
*G01R 31/27* (2006.01)
*H01L 23/48* (2006.01)

(52) U.S. Cl.
CPC .............. *H01L 22/14* (2013.01); *H01L 22/32* (2013.01); *H01L 23/481* (2013.01); *H01L 25/50* (2013.01); *H01L 2225/06506* (2013.01); *H01L 2225/06513* (2013.01); *H01L 2225/06527* (2013.01); *H01L 2225/06544* (2013.01); *H01L 2225/06562* (2013.01); *H01L 2225/06596* (2013.01)

(58) Field of Classification Search
USPC ......................................................... 257/737
See application file for complete search history.

(56) References Cited

U.S. PATENT DOCUMENTS

| | | | |
|---|---|---|---|
| 7,170,160 | B1 | 1/2007 | Wang |
| 7,226,870 | B2 | 6/2007 | Boufnichel et al. |
| 7,999,390 | B2 | 8/2011 | Ishigaki et al. |
| 2006/0046475 | A1 | 3/2006 | Wark et al. |
| 2006/0076690 | A1 | 4/2006 | Khandros et al. |
| 2008/0237891 | A1 | 10/2008 | Irsigler et al. |
| 2013/0032946 | A1* | 2/2013 | West .................. H01L 21/78 257/774 |
| 2014/0252656 | A1* | 9/2014 | Lee .................... H01L 25/0657 257/777 |
| 2015/0108656 | A1* | 4/2015 | Juneja ................ H01L 25/0657 257/774 |
| 2015/0255427 | A1* | 9/2015 | Sung .................. H01L 25/0652 257/737 |
| 2015/0357310 | A1* | 12/2015 | Kim .................... H01L 25/0657 257/774 |

OTHER PUBLICATIONS

Lewis, Dean L. et al., "Test strategies for 3D die stacked integrated circuits." *Workshop on 3D Integration, Nice, France*, Apr. 2009, 6 pages. http://arch.ece.gatech.edu/mars.html.

Taouil, Mottaqiallah et al., "How significant will be the test cost share for 3D die-to-wafer stacked-ICs?" *Design & Technology of Integrated Systems in Nanoscale Era (DTIS), 6th International Conference IEEE*, 6 pages, 2011.

Zschech, Ehrenfried et al., (eds.), *Materials for Information Technology: Devices, Interconnects and Packaging*, Springer-Verlag, London, 2005, "Wafer-Level Three-Dimensional Hyper-Integration Technology," pp. 407-409.

* cited by examiner

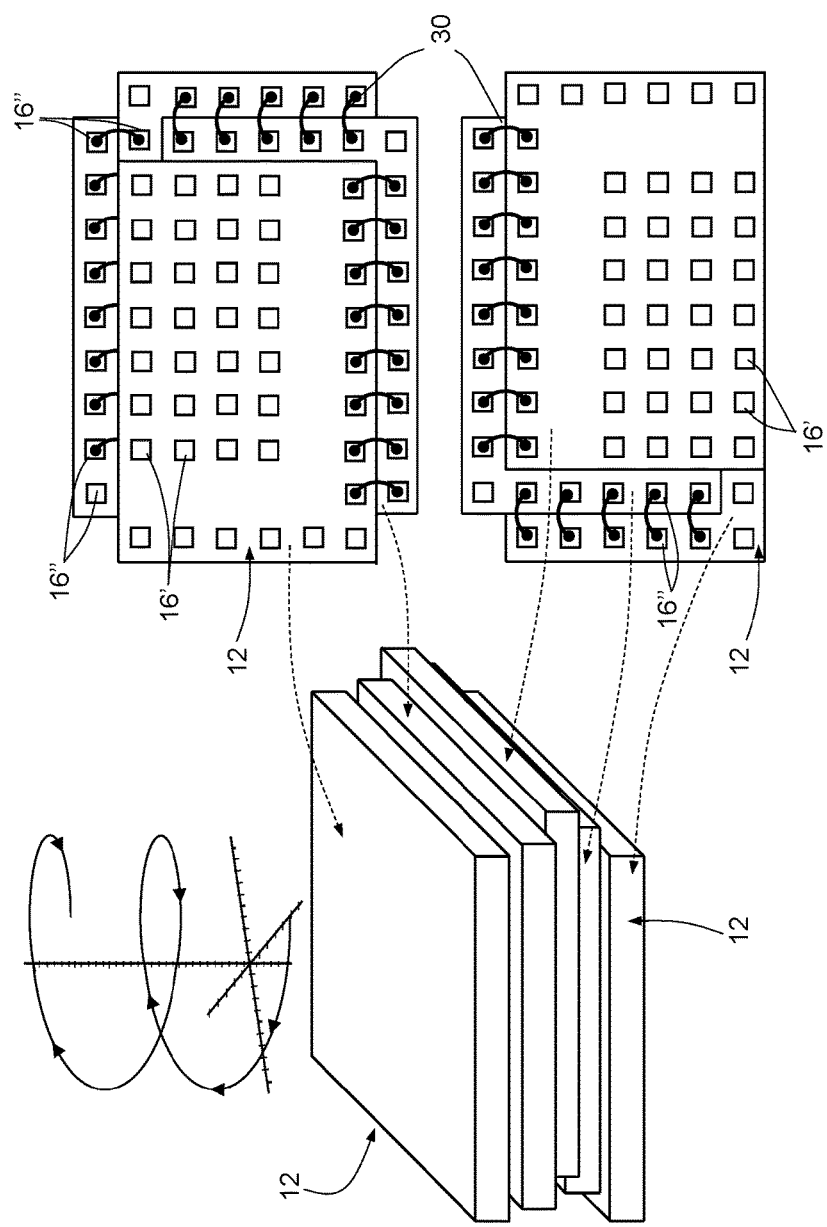

SEMICONDUCTOR ELECTRONIC DEVICE WITH IMPROVED TESTING FEATURES AND CORRESPONDING PACKAGING METHOD

BACKGROUND

Technical Field

The present disclosure relates to a semiconductor electronic device with improved testing features, during an electrical testing operation, for example in the final steps of a corresponding manufacturing process. The present disclosure further relates to a corresponding packaging method.

Description of the Related Art

The desire is generally felt, in the field of packaging of semiconductor electronic devices, for size reduction, in particular in the field of portable electronic apparatuses, such as smartphones, tablets, phablets, wearable apparatuses, and the like.

Moreover, the recent trend is known to provide, inside a single package, complex electronic systems, to obtain a so-called SiP (System-in-Package), including a number of dies of semiconductor material housed in a same package. The various dies integrate respective integrated circuits including, for example, MEMS (Micro-Electro-Mechanical Systems) structures, analog, digital, or mixed-signal electronic interface circuits (the so-called ASICs—Application-Specific Integrated Circuits), memories, logic processing units, radiofrequency circuits, and the like, generally co-operating with one another to perform one or more desired functions.

The various dies within the package are electrically connected in an appropriate manner to enable exchange of electrical signals, and electrical connection elements are further provided carried by an outer surface of the package, for interfacing with external electronic systems, for example for electrical coupling with a printed circuit board (PCB).

In particular, stacked-packaging solutions are known, envisaging that the various dies are arranged in the package vertically stacked on one another, in order to obtain a smaller horizontal dimension of the package and in general to optimise the resulting size.

For instance, FIG. 1 shows a possible solution of a stacked-die package 1.

In the example illustrated, a first die 2, for example including a MEMS structure is stacked on a second die 3, for example including an ASIC, within the package 1.

The stacked structure constituted by the first and second dies 2, 3 is arranged on a supporting layer 4, constituting the base of the package 1 and having a top surface 4a, which is in contact with the second die 3, and a bottom surface 4b, which is in contact with the environment external to the package 1 and carries appropriate electrical contact elements 5, in the example in the form of lands, designed, for example, for coupling with a printed circuit board (PCB) (likewise, electrically conductive bumps may, instead, be provided).

The direction of stacking of the first and second dies 2, 3 within the package 1 is vertical, i.e., along a vertical axis z orthogonal to the plane of horizontal extension xy of the top and bottom surfaces 4a, 4b of the supporting layer 4.

In particular, the first and second dies 2, 3 each have a respective top surface, which lies parallel to the aforesaid horizontal plane xy, provided on which are respective contact pads 6, electrically connected to the MEMS structures and/or to the electronic circuits integrated in the same dies (as will be evident to a person skilled in the field).

Further contact pads 7 are provided on the top surface 4a of the supporting layer 4, and electrical connection wires 8, according to the so-called wire-bonding technique, electrically connect the electrical contact pads 6 of the first and second dies 2, 3 to the further contact pads 7. Electrical connection between the further contact pads 7 and the electrical contact elements 5 carried by the bottom surface 4b of the supporting layer 4 is provided by through silicon vias 9 that traverse the entire thickness (along the vertical axis z) of the supporting layer 4.

An insulating coating 10, the so-called "mould compound", made, for example, of epoxy resin, coats the stacked structure of the first and second dies 2, 3, and the outer portions of the top surface 4a of the supporting layer 4 not covered by the second die 3. A top surface 10a of the insulating coating 10 constitutes an outer surface of the entire package 1, in contact with the external environment.

The solution described, although providing in a compact manner electrical coupling between the first and second dies 2, 3 and between the same dies 2, 3 and the external environment, has, however, a limitation due to the dimensions of the stacked dies, which decrease in the horizontal plane xy as the distance along the vertical axis z from the front surface 4a of the supporting layer 4 increases. In fact, as is evident from an examination of FIG. 1, the dies that are vertically stacked on one another have an "encumbrance" in the horizontal plane xy that progressively decreases starting from the top surface 4a of the supporting layer 4. Moreover, the same dies have a different size in the horizontal plane xy.

There follows an upper limit to the number of dies that may be stacked vertically inside the package 1, a limit that may not be acceptable, at least in certain applications, and further constitutes a limitation to optimal exploitation of the space inside the package 1.

A further solution that has been proposed to overcome the above limitations is illustrated in FIG. 2.

In this case, the dies inside the package 1 are vertically stacked on one another, aligned along the vertical axis z, and have substantially the same encumbrance in the horizontal plane xy. In particular, FIG. 2 illustrates, by way of example, three dies, a first die and a second die, once again designated by 2 and 3, and also a third die 13.

As is known, and as illustrated schematically, each die 2, 3, 13 comprises a respective substrate 2a, 3a, 13a of semiconductor material, for example silicon, provided in which, with known techniques (not described in detail herein) is an appropriate integrated circuit, including, for example, digital, analog, or mixed-signal electronic circuits, memories, logic processing units, radiofrequency circuits, MEMS structures, etc.

Each die 2, 3, 13 further comprises, above the substrate, a multi-layer 2b, 3b, 13b constituted by the superposition of a number of metallization layers, connected together by through vias, and interposed dielectric layers. The aforesaid electronic circuit may be formed, at least in part, also within the multi-layer 2b, 3b, 13b; for example, a gate-oxide region of a MOS transistor may be defined in a first insulating layer of this multi-layer, and a corresponding gate region in a first conductive layer thereof.

Suitable electrical paths (not illustrated herein) are provided within the multi-layer 2b, 3b, 13b designed to transfer electrical signals between the integrated electronic circuit and respective contact pads 6, which are provided at least in part in a top metallization layer of the multi-layer 2b, 3b, 13b and are arranged on the top surface of the respective dies 2, 3, 13.

In this case, the electrical connection between the dies 2, 3, 13 is provided by respective internal through silicon vias (TSVs) 11, which traverse the entire thickness (along the vertical axis z) of the substrate 2a, 3a, 13a of each die 2, 3, 13, electrically coupling to the pads 6 of the underlying die in the stack and reaching a top surface of the same substrate 2a, 3a, 13a. In the case of the first die 2, the internal through silicon vias 11 are electrically coupled (by appropriate connection paths, not illustrated) to the through silicon vias 9 provided through the supporting layer 4, so that the electrical signals are transported from the stacked structure of the dies 2, 3, 13 towards the electrical connection elements 5 on the outside of the package 1.

Although advantageous, in so far as it enables a further reduction of the horizontal dimensions of the package and does not have limitations to the vertical stacking of a desired number of dies, also this solution has a number of drawbacks.

In particular, during electrical testing, performed, for example, at the end of the manufacturing process, this solution does not in general enable access to the contact pads 6 of the dies (in the example, the dies 2 and 3) arranged inside the stacked structure, in so far as they are covered by overlying dies; basically, there are portions of the resulting stacked structure that may not be reached and are not observable, and thus may not be tested.

As it is clear, this problem is accentuated when two or more dies, as in the example illustrated in FIG. 2, have the same or comparable encumbrance in the horizontal plane xy.

Accordingly, there may be situations in which electrical testing does not enable identification of malfunctioning of the resulting electronic device, or else determination of the origin of any found malfunctioning, or in any case does not allow to show that the desired performance has been achieved.

BRIEF SUMMARY

One embodiment of the present disclosure solves, at least in part, the aforesaid problems, and in particular to provides a packaging solution for vertically stacked dies that will enable improved performance and in particular improved testing features to be achieved.

According to the present disclosure, an electronic device includes a first stacked structure including a first plurality of semiconductor dies. Each semiconductor die includes a respective integrated circuit of a plurality of integrated circuits, and has a respective top surface which extends parallel to a horizontal plane. The semiconductor dies are stacked on one another in a vertical direction, transverse to the horizontal plane, and are staggered parallel to the horizontal plane. The electronic device also includes a first plurality of contact pads positioned at a first portion of the top surface of a lower die of the first plurality of semiconductor dies; and a second plurality of contact pads positioned at a second portion of the top surface of the lower die. The first portion is covered by an overlying die of the first plurality of semiconductor dies and the second portion is exposed and freely accessible from outside the first stacked structure. The overlying die includes internal through silicon vias traversing a substrate of the overlying die and electrically coupled to at least some of the contact pads of the first plurality to set in electrical contact the lower and overlying dies in the first stacked structure.

BRIEF DESCRIPTION OF THE SEVERAL VIEWS OF THE DRAWINGS

For a better understanding of the present disclosure, a description of a preferred embodiment thereof is now provided, purely by way of non-limiting example and with reference to the attached drawings, in which:

FIG. 18 is a schematic perspective view of an arrangement of stacked dies, according to a further embodiment of the present solution.

DETAILED DESCRIPTION

As will be described in greater detail hereinafter, one aspect of the present solution envisages vertically stacking the dies of semiconductor material in the package, so that they are horizontally staggered.

Figure 3:
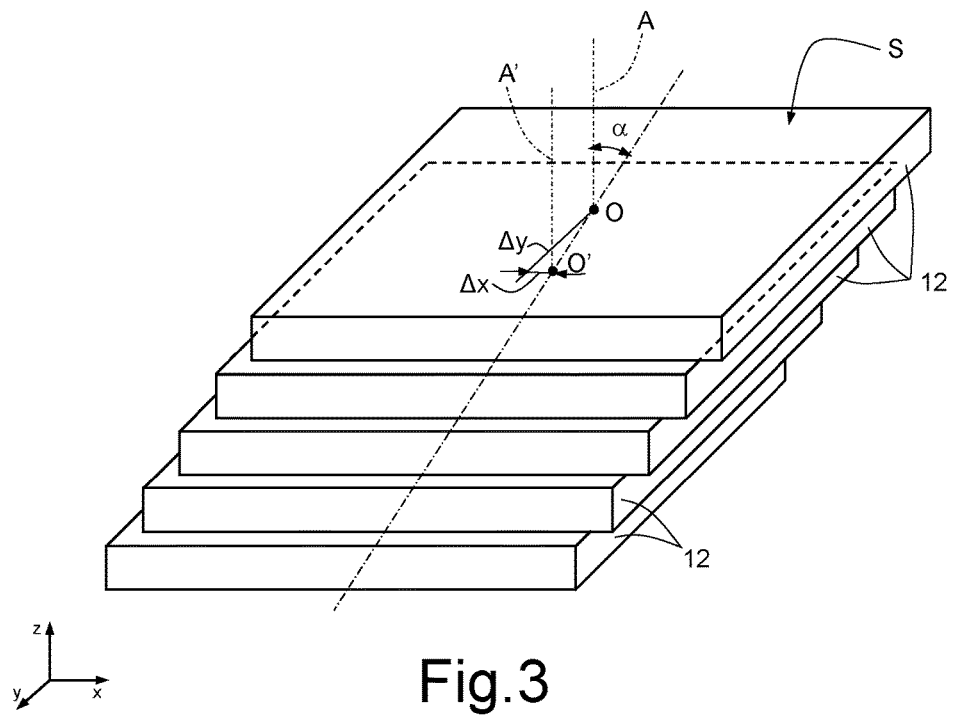
FIG. 3 is a schematic perspective view of an arrangement of stacked dies, according to one aspect of the present solution.

As illustrated schematically in FIG. 3, where the dies, designated by 12, are purely by way of example five in number, the axes of symmetry A, A' parallel to the vertical axis z, of two stacked dies 12 are vertically not aligned along the vertical axis z, but staggered by a first deviation Δx along a first horizontal axis x of the horizontal plane, and by a second deviation Δy along a second horizontal axis y of the same horizontal plane xy (the first and second deviations Δx, Δy may, for example, be equal).

The stacked structure is thus globally inclined by a certain (non-zero) staggering angle α with respect to the vertical axis z. In particular, this staggering angle α is formed between the vertical axis z and a line joining the geometrical centres O, O' in the horizontal plane xy of the top surfaces S of the dies 12.

Figure 4A:
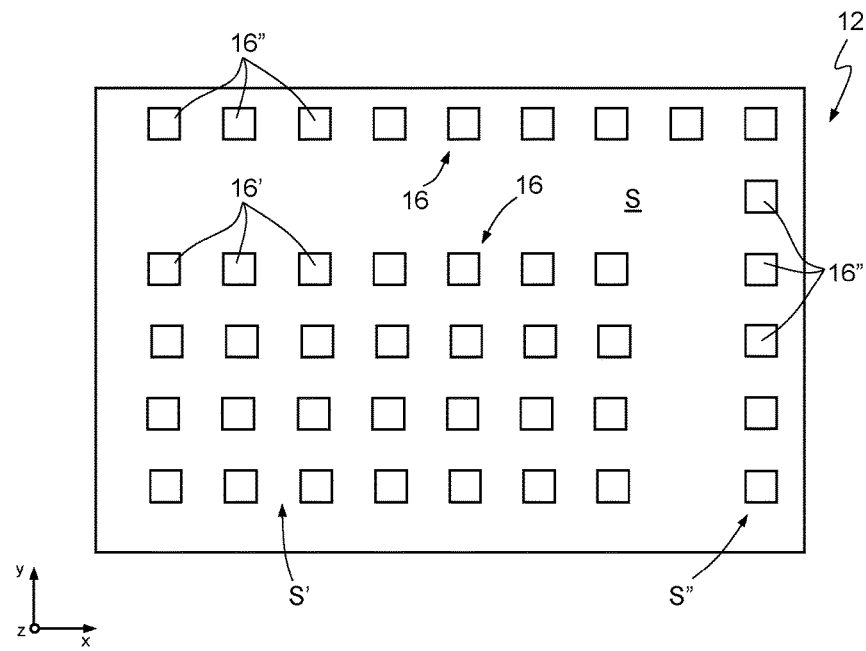
FIG. 4a is a schematic top plan view of one of the stacked dies of FIG. 3.
Figure 4B:
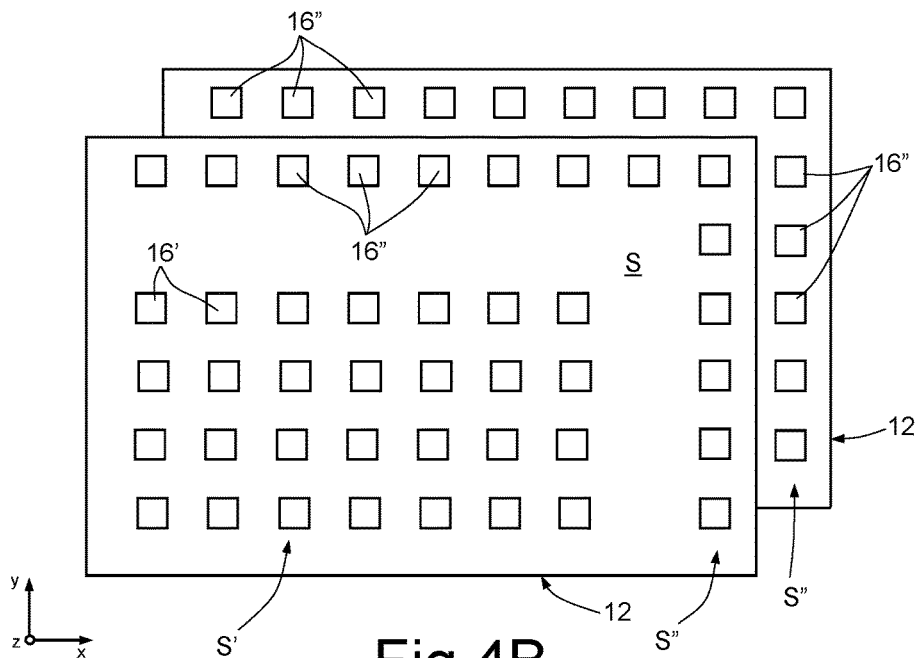
FIG. 4b is a schematic top plan view of the arrangement of two stacked dies.

As indicated also in the subsequent FIGS. 4a and 4b, in the top surface S of each die 12 there may consequently be identified: a first portion S', designed to be covered by the overlying die 12 in the stacked structure; and a second portion S", which instead remains free from the same overlying die 12 in the stacked structure.

In the shown example, which regards an embodiment in which the dies 12 have the same encumbrance in the horizontal plane xy, in the example having a substantially rectangular top surface S, with a same perimeter and a same surface area in the horizontal plane xy, the second portion S" is arranged along two orthogonal sides of the aforesaid perimeter, where it defines two surface strips free from the overlying die 12 (defining basically a "half-frame"). The first portion S' is constituted by the remaining portion of the top surface S, which in the example has a rectangular extension in the horizontal plane xy, delimited externally by the second portion S" along the aforesaid two orthogonal sides.

On the top surface S, the die 12 has a plurality of contact pads, designated as a whole by 16.

According to a particular aspect of the present solution, at the first portion S' of the surface S, the die 12 has a first plurality of contact pads 16', purely by way of example, here arranged in rows and columns to form an array. In the second portion S" of the same surface S, the die 12 further has a second plurality of contact pads 16", by way of example here arranged to form a row along the first side of the aforesaid perimeter and a column along the other side of the same perimeter.

The contact pads 16" of the first plurality thus remain exposed in the stacked structure of the dies 12, whereas the contact pads 16' of the first plurality are covered.

Figure 1:
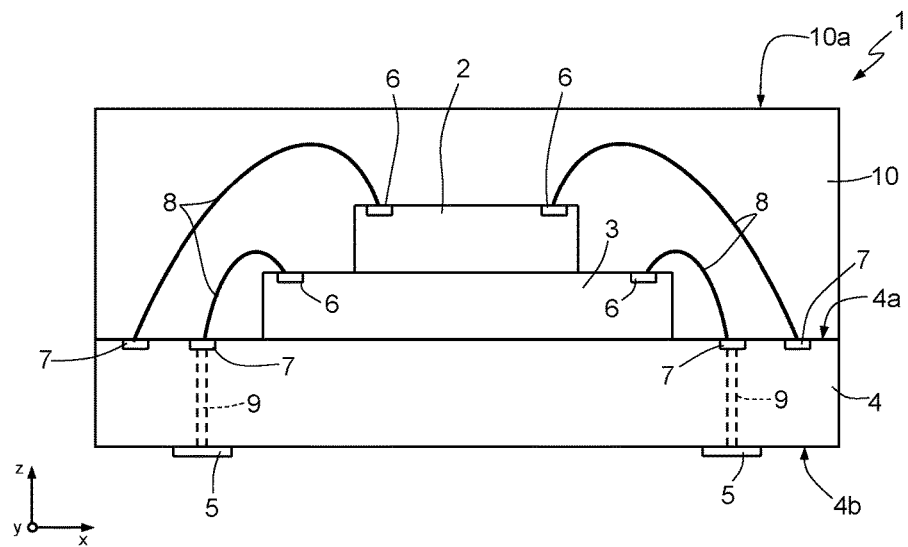
FIG. 1 is a schematic cross-sectional view of a package of an electronic device including a stacked-die structure, of a known type.
Figure 2:
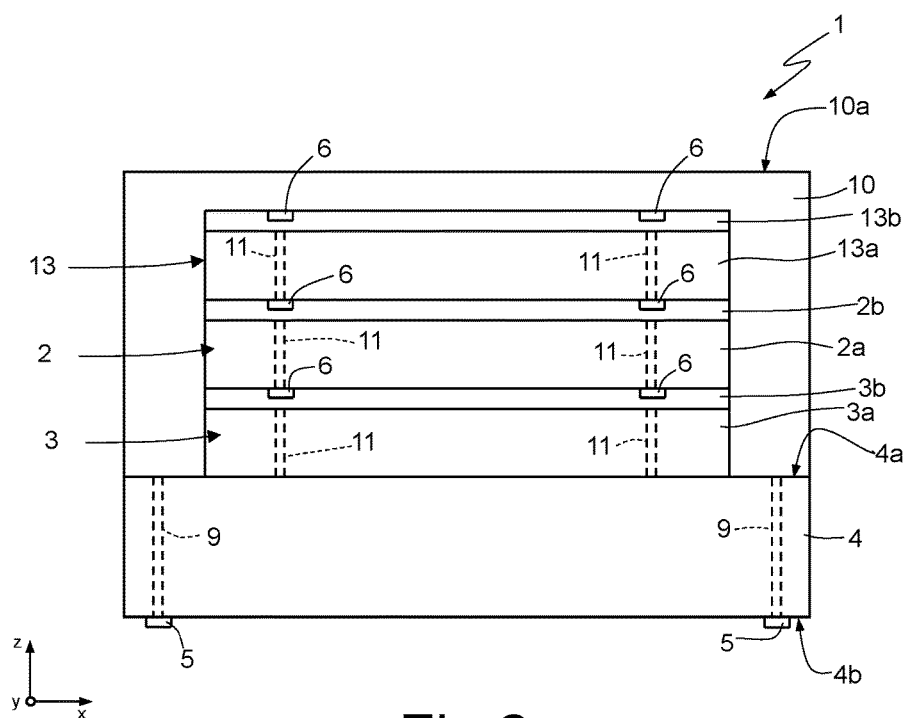
FIG. 2 is a schematic cross-sectional view of a different package of an electronic device including a stacked-die structure, being also of a known type.

Reference is now made to FIG. 4c, where once again there may be distinguished (in a schematic way equivalent to what has been discussed with reference to FIG. 2) the portions constituting each die 12, i.e.: the respective substrate 12a, the multi-layer 12b, comprising one or more metal layers and dielectric interposed layers, provided in which are the contact pads 16 and also appropriate conductive paths, here designated as a whole by 15, between the same contact pads 16 and an integrated circuit, designated as a whole by 18, provided in the substrate 12a of the die 12 and including one or more from among: a digital, an analog, or a mixed-signal electronic circuit, a memory, a logic processing unit, a radiofrequency circuit, and an electromechanical structure.

Appropriate openings 19 are defined in this dielectric layer 17, at the aforesaid contact pads 16.

A particular aspect of the present solution envisages that at least some of the contact pads 16' of the first plurality are designed to provide the electrical connections between stacked dies 12, being in electrical contact with internal through silicon vias (TSV) 11 of the overlying die 12 in the stacked structure. In the example illustrated, all the contact pads 16' are arranged in electrical contact with the internal through silicon vias 11.

The internal through silicon vias 11 thus have: a bottom end 11a that projects from a bottom surface of the substrate 12a of the respective die 12 to enter the openings 19 and be in contact with the contact pads 16' of the die 12 arranged underneath in the stacked structure; and a top end 11b, which is arranged, for example, on a top surface of the substrate 12a and is designed for electrical contact with the integrated circuit 18 or with one or more of the contact pads 16 of the same die 12, by appropriate conductive paths 21 provided in the multi-layer 12b.

In an alternative embodiment, not illustrated in the figures, the bottom end 11a that projects from the bottom surface of the substrate 12a of the respective die 12 may even not enter the windows 19 and be in contact with electrically conductive bumps present on the contact pads 16'.

The contact pads 16" of the second plurality are, instead, designed to enable, during electrical testing, testing of operation of the stacked-die structure 12, being advantageously freely accessible from the outside of the aforesaid stacked structure.

Figure 4C:
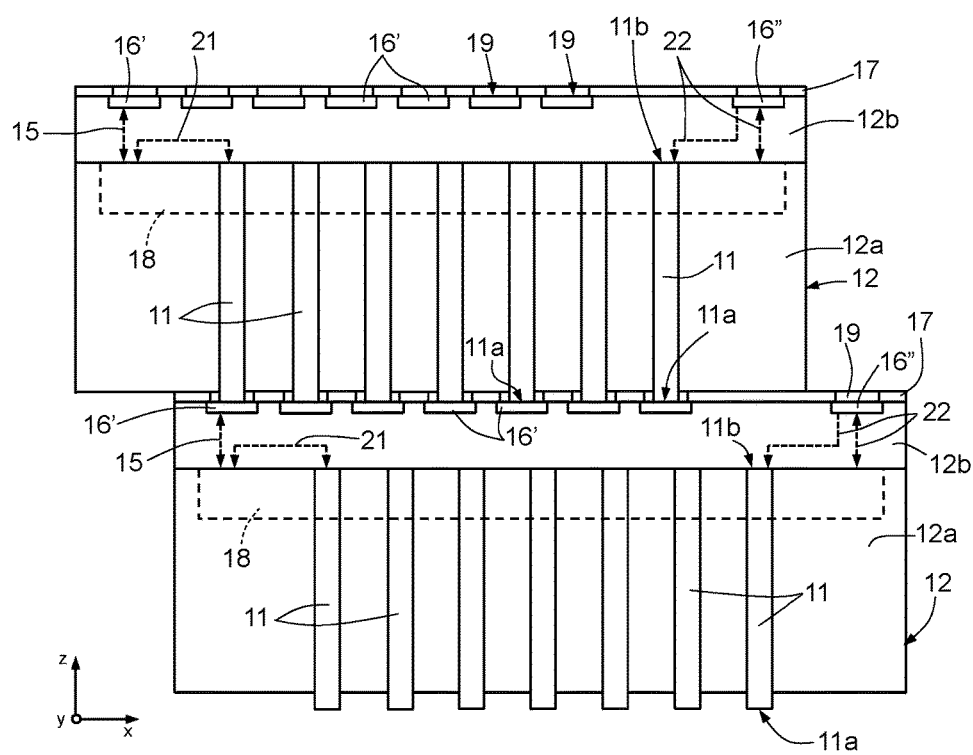
FIG. 4c is a schematic cross-sectional view of the two stacked dies of FIG. 4b.

In particular, as represented schematically in FIG. 4c, appropriate conductive paths 22 are provided for this purpose from the contact pads 16" to the integrated circuit 18 and/or to the internal through silicon vias 11, for carrying suitable electrical testing signals.

Thus, since it is possible to access all the dies 12, tests may be performed to check proper operation of the individual dies 12, of the overall system, or of any partial subsystem created by stacking the same dies 12.

Figure 5:
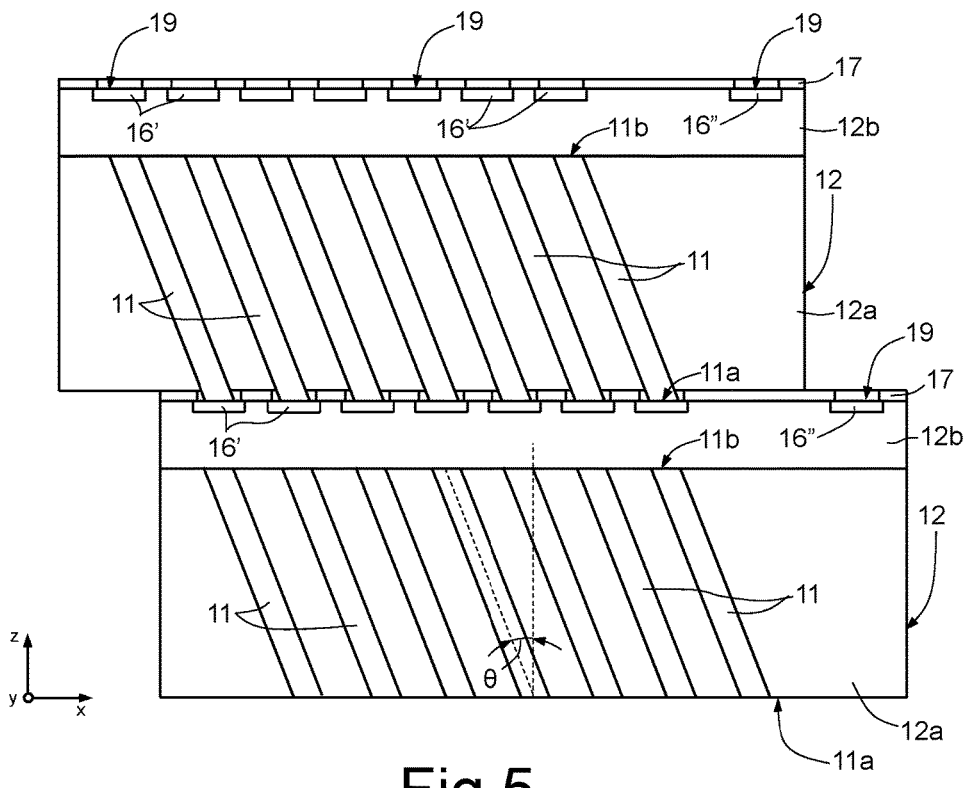
FIG. 5 is a schematic cross-sectional view of the two stacked dies, according to a different embodiment.

As illustrated in FIG. 5 (which, like the subsequent figures, shows in a simplified manner the stacked structure of the dies 12, for reasons of simplicity of illustration), a further aspect of the present solution envisages that the internal through silicon vias 11 provided through the substrate 12a, instead of being substantially parallel to the vertical axis z (as in the solution illustrated in FIG. 4c), are oblique, inclined by a certain (non-zero) angle of inclination θ with respect to the vertical axis z (the angle of inclination θ is formed between the vertical axis z and an axis of symmetry B of the internal through silicon vias 11).

The above angle of inclination θ may advantageously be equal to the staggering angle α of the arrangement of the stacked-die structure 12.

The present Applicant has realized that such a sloping arrangement of the internal through silicon vias 11 may enable a greater exploitation of the area available for the electrical connections between the dies 12 in the stacked structure, enabling, in fact, a larger number of internal through silicon vias 11 (comparable to an equivalent stacked structure with zero angle of inclination θ, thus preventing the presence of a non-zero angle of inclination θ of the stacked structure from reducing the number of internal through silicon vias 11).

In this regard, several techniques are known for providing oblique through silicon vias through a substrate of semiconductor material.

For instance, oblique trenches for the internal through silicon vias 11 may be formed by anisotropic chemical etching of the substrate 12a (for example, by TMAH or KOH etching). Alternatively, the oblique trenches for the internal through silicon vias 11 may be formed by laser digging, the laser being appropriately oriented in an oblique direction with respect to the vertical axis z on the top surface of the substrate 12a.

In any case, once the oblique trenches have been formed in the substrate 12a, the same trenches are insulated laterally with respect to the substrate 12a, for example by thermal oxidation for preventing or at least limiting the presence of leakage currents towards the same substrate 12a and are then filled with an appropriate conductive material.

After this, the bottom surface of the substrate 12a may be subjected to so-called "back grinding" and to chemical etching so that the second end 11b of the internal through silicon vias 11 protrudes from the bottom surface of the substrate 12a (as previously discussed).

Figure 6:
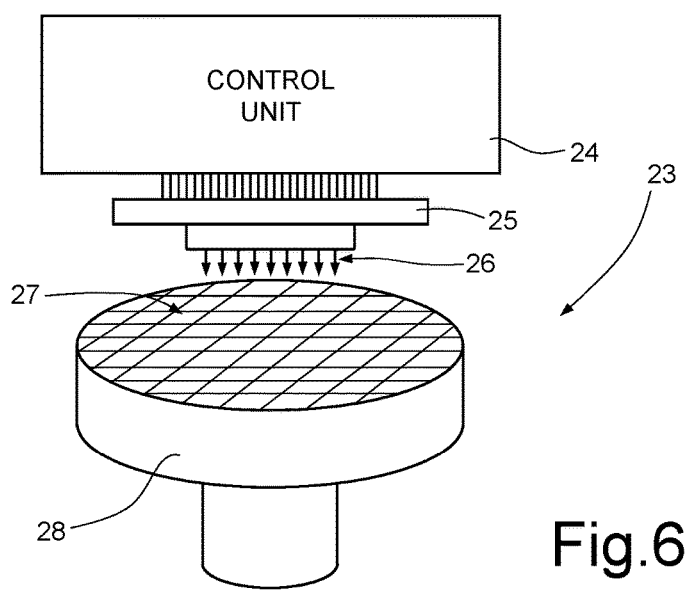
FIG. 6 is a general block diagram of an electrical-testing system.

FIG. 6 illustrates a system, of a known type, for carrying out electrical testing of integrated semiconductor devices.

The test system 23, usually defined as "test cell", comprises a control unit or ATE (Automatic Test Equipment) 24, an electronic probe card 25, operatively coupled to the control unit 24, and a plurality of probes 26, designed for carrying out testing of a wafer 27 of semiconductor material, carried by a support 28 forming part of a handling unit (so called prober) not illustrated herein for simplicity.

In particular, the test system 23 allows to perform an automatic procedure of testing and electrical sorting of the various dies integrated in the wafer 27 (prior to the corresponding sawing operation) for selecting the dies operating properly for their subsequent encapsulation in the package. This operation is known as EWS (Electrical Wafer Sorting) or WS (Wafer Sorting) and may envisage execution of appropriate electrical tests on the circuits integrated in the various dies, including operations of testing of the corresponding through silicon vias, where present.

The aforesaid electrical test envisages, for example, that an appropriate test current is made to flow in the through silicon vias for evaluating the electrical resistance opposed to the flow of current (see, for example the patent application U.S. 2013/0057312 A1, filed in the name of the present Applicant). In addition, or as an alternative, the electrical test envisages measuring the electrical insulation of the through silicon vias from the substrate in which they are provided. It should be noted that the electronic probe card 25 may be configured to enable simultaneous electrical testing of a plurality of through silicon vias.

Figure 7:
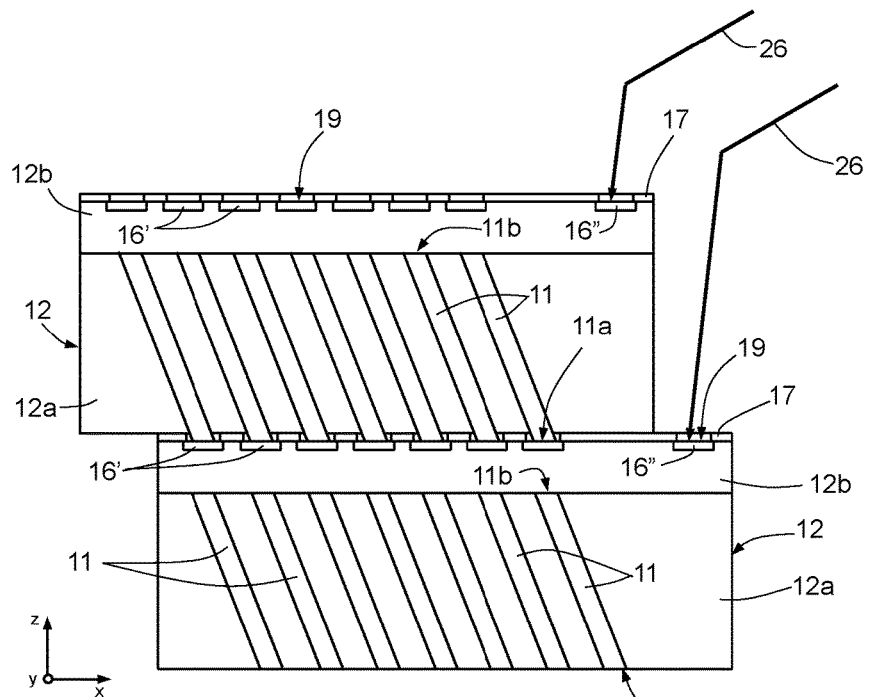
FIG. 7 is a schematic cross-sectional view of the two stacked dies undergoing an electrical testing operation.

As illustrated in FIG. 7 (which shows, by way of example, internal through silicon vias 11 with oblique arrangement; altogether similar considerations apply, however, in the case where internal through silicon vias 11 aligned to the vertical axis z are present), when the test system 23 is coupled to the stacked structure formed by the dies 12, the probes 26 are brought into (mechanical and electrical) contact with the contact pads 16" of the second plurality, which are advantageously accessible from outside the same stacked structure, as discussed previously.

It should be noted that the probes 26 may advantageously have different length and characteristics, and have the corresponding tips aligned in different horizontal planes, based on the layout of the stacked structure of the dies 12.

In a per se known manner (not discussed in detail herein), the control unit 24 is able to control the electronic probe card 25 to carry out electrical testing of operation of the stacked-die structure 12, and in particular of the integrated circuits 18 provided in the dies 12 and/or of the internal through silicon vias 11 and/or of the through silicon vias 9.

Figure 8:
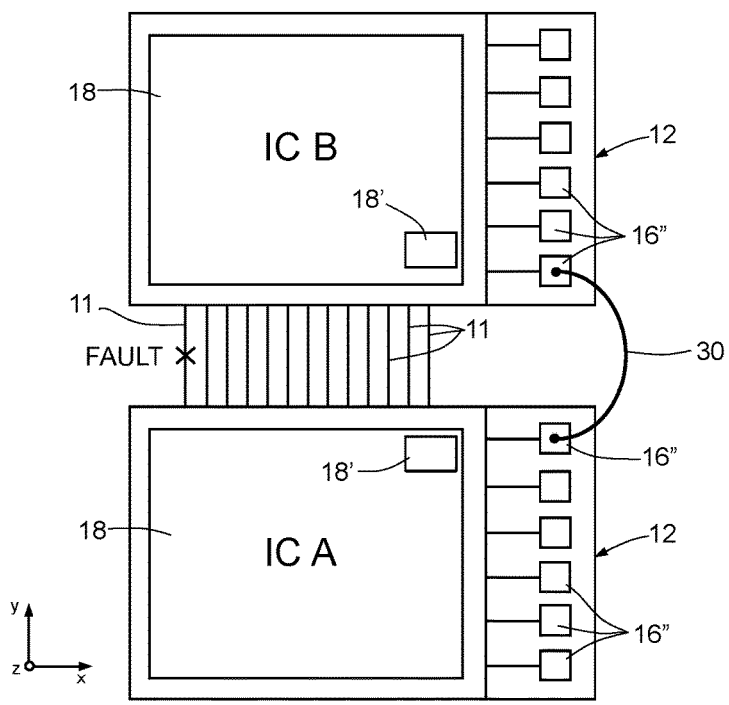
FIG. 8 is a schematic view of the electronic system represented by the two stacked dies of FIG. 7.

As illustrated schematically in FIG. 8, a further aspect of the present disclosure envisages, in the case where the testing operation identifies a fault in one or more of the internal through silicon vias 11, the possibility of replacing the electrical connection between the dies 12 that was ensured by that internal through silicon via 11 with one or more electrical connection wires 30 (with the so-called "wire bonding" technique) that electrically connect one or more pairs of contact pads 16" of the second plurality carried by the dies 12 stacked on one another.

In other words, according to this aspect of the present solution, the contact pads 16" of the second plurality, in addition to being used for electrical testing, may be used for contributing to the electrical connection between the dies 12 in order to replace internal through silicon vias 11 that prove faulty according to the electrical testing operations.

In the example illustrated in the aforesaid FIG. 8, which regards purely by way of example a single fault present at an internal through silicon via 11, the electrical connection wire 30 consequently connects together two contact pads 16", which are appropriately electrically connected, by the conductive paths 22 (in the two dies 12 stacked on one another) to the bottom end 11a and top end 11b, respectively, of the internal through silicon via 11 that has proven faulty. In this way, the electrical connection between the dies 12, which according to design was provided by the aforesaid internal through silicon via 11, that has proven faulty, is advantageously restored.

In particular, the integrated circuits 18 of the dies 12 may for this purpose envisage appropriate configurable (or programmable) circuits 18', which are designed to enable appropriate reconfiguration of the electrical paths 22 according to the outcome of the electrical-testing operations. These configurable circuits 18' may, for example, be controlled by the control unit 24 of the test system 23, or else by appropriate self-test circuits of a BIST (Built-In Self Test) type, which are also integrated in the dies 12, in this way ensuring reconfigurability of the electrical connections and possibility of repairing failures (BISR—Built-In Self Repair) also during the service life of the resulting electronic system.

To exploit fully the functionalities of the BISR, electrical connection wires 30 may thus be envisaged, that are additional to those required for repairing the faults detected in the initial test and that may be used during the service life of the device, for increasing the life of the device, and improving its quality and reliability.

Figure 9:
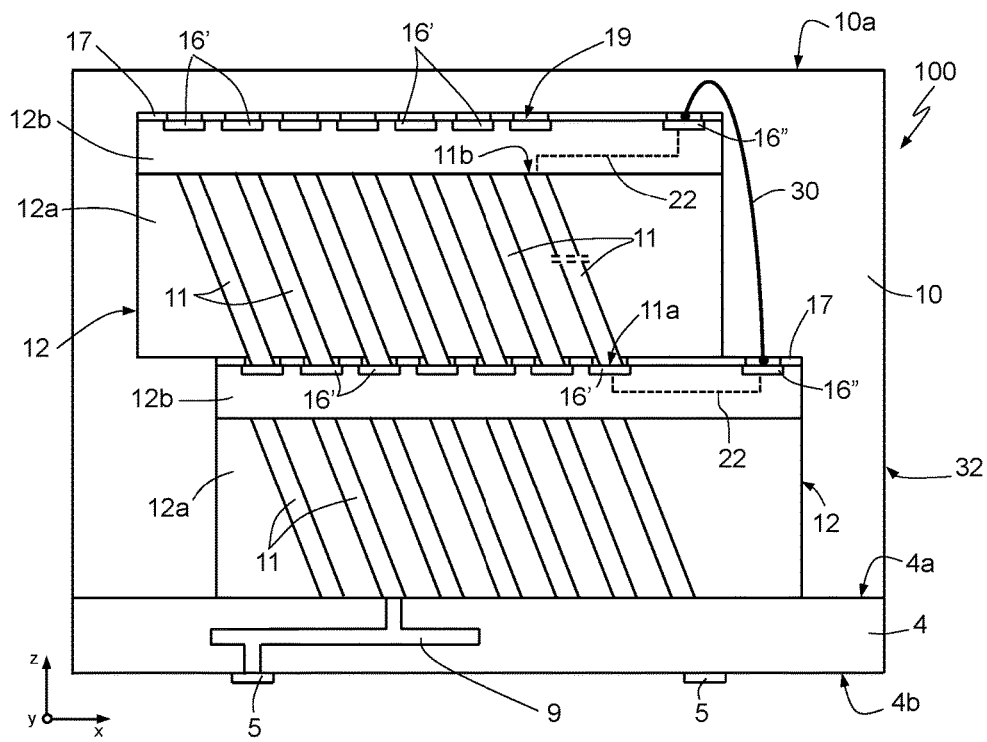
FIG. 9 is a schematic cross-sectional view of the two stacked dies, encapsulated in a package.

FIG. 9 is a schematic illustration of the repair operation for an internal through silicon via 11 that has proven faulty following the electrical testing operations; FIG. 9 in particular shows that the electrical paths 22 are appropriately configured to electrically couple the contact pads 16" of the two dies 12 with the circuit elements connected to the bottom and top ends 11a, 11b of the internal through silicon via 11 that is to be replaced with the electrical connection wire 30.

It should be noted that, in general, the number of electrical connection wires 30 may depend upon the number of internal through silicon vias 11 that have proven faulty after the electrical testing operations, and thus devices of the same type with the same commercial name may differ from one another, having a different number and arrangement of the electrical connection wires 30.

FIG. 9 further illustrates the resulting electronic device 100, the package 32 of which comprises an insulating coating, once again designated by 10, made, for example, of epoxy resin, which coats the stacked structure of the dies 12, in this case on top and at the sides, further coating the electrical connection wires 30 (in this case present for repairing the faults of the internal through silicon vias 11).

The package 32 further comprises the supporting layer, once again designated by 4, constituting the base of the package 32 and having a top surface 4a, which is in contact with the bottom die 12 in the stacked structure, and a bottom surface 4b, which is in contact with the external environment and carries appropriate electrical contact elements 5, in the example in the form of lands, designed for instance for coupling with a PCB.

Through silicon vias 9, or more in general the electrical connection structures represented by conductive paths and vias for connection between the same paths, are appropriately provided through the supporting layer 4 (which may be, for example, a PCB), for electrical connection between the internal through silicon vias 11 of the aforesaid die 12, which is the bottom one in the stacked structure, and the electrical contact elements 5 on the outside of the package 32.

Figure 10:
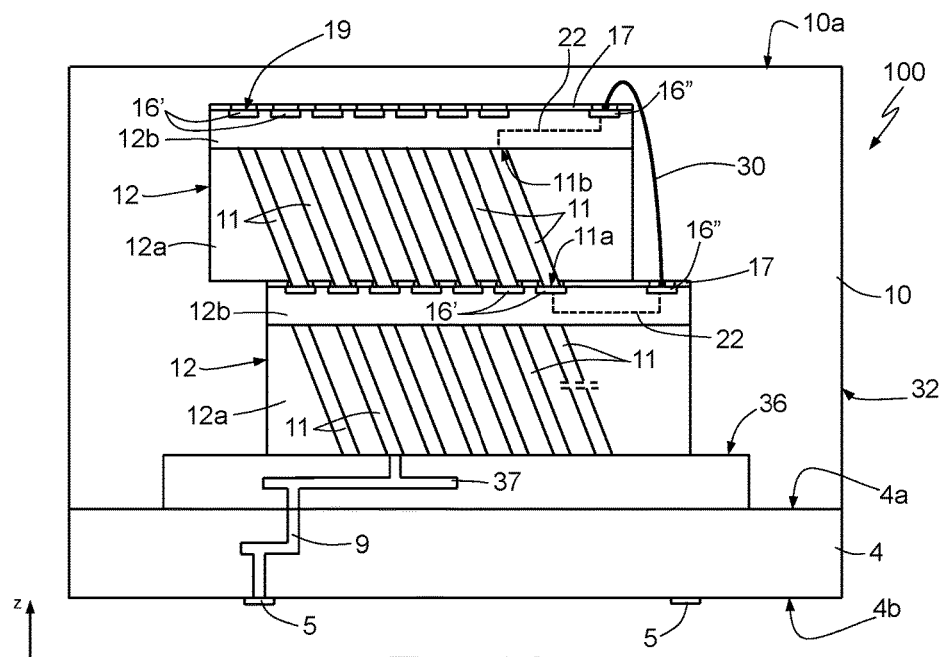
FIG. 10 is a schematic cross-sectional view of the two stacked dies encapsulated in a package, according to a further embodiment.

In the example illustrated in FIG. 10, the package 32 further comprises an interposer layer 36, which for example may be made of a semiconductor material such as silicon, arranged between the die 12, arranged at the bottom in the stacked structure, and the supporting layer 4.

In this case, through the interposer layer 36 further conductive paths 37 are provided, which route the electrical signals from the bottom ends 10a of the internal through silicon vias 11 of the die 12 arranged at the bottom in the stacked structure towards the through silicon vias 9 provided through the thickness of the base layer 4.

Advantageously, routing through the interposer layer 36 may enable, for example, adjusting of the spacing between the through silicon vias 9 and the electrical contact elements 5 on the outside of the package 32.

Figure 11:
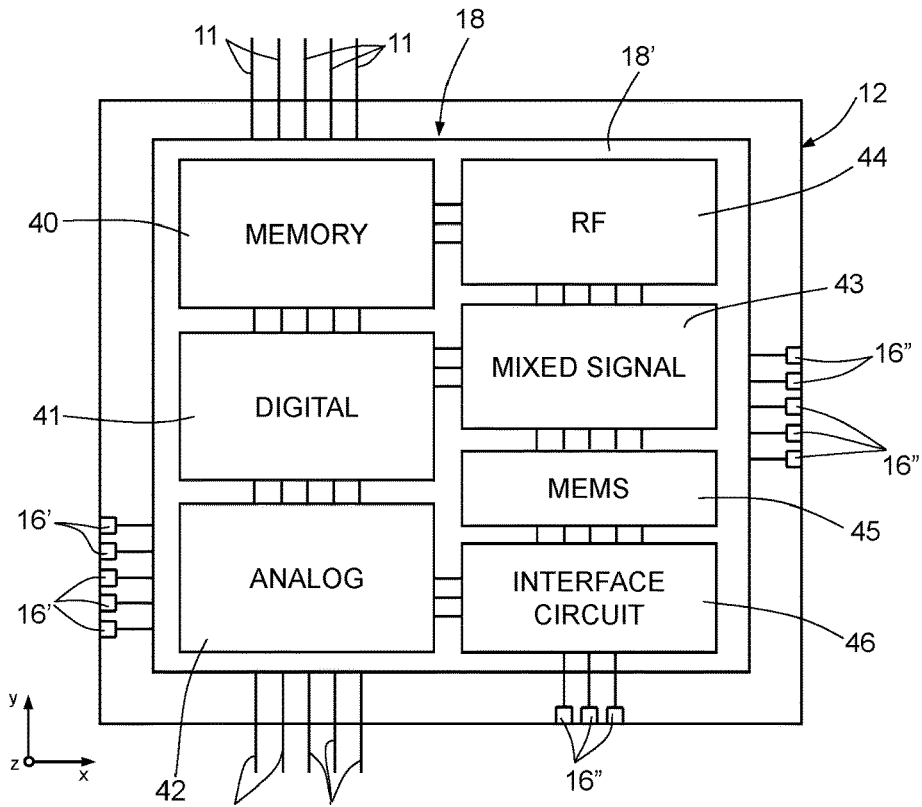
FIG. 11 is a general block diagram of an integrated circuit within one of the stacked dies.

FIG. 11 is a schematic illustration of a possible embodiment of the integrated circuit 18 provided in the die 12.

In this embodiment, the integrated circuit 18 comprises, operatively coupled together: a memory 40, of a non-volatile type; a digital circuit 41; an analog circuit 42; a mixed-signal circuit 43; a radiofrequency circuit 44; and a MEMS structure 45.

According to a particular aspect of the present solution, the integrated electronic circuit 18 further comprises: the aforesaid configurable circuit 18', and moreover an interface configuration circuit 46, which receives from outside appropriate control signals in order to set the configurable circuit 18', for reconfiguration of the electrical connections, as previously described in detail.

In particular, the interface configuration circuit 46 is electrically coupled to a certain number of contact pads 16" of the second plurality for receiving the control signals, for example from the control unit 24 of the test system 23 during electrical testing; the configurable circuit 18' is further coupled to a certain number of contact pads 16" of the second plurality for enabling reconfiguration of the electrical paths 22 and in general of the same integrated circuit 18, in case of need (as discussed in detail previously).

Furthermore, one or more of the components of the integrated electronic circuit 18 are connected to a certain number of contact pads 16' of the first plurality and/or to a certain number of the internal through silicon vias 11.

Figure 12A:
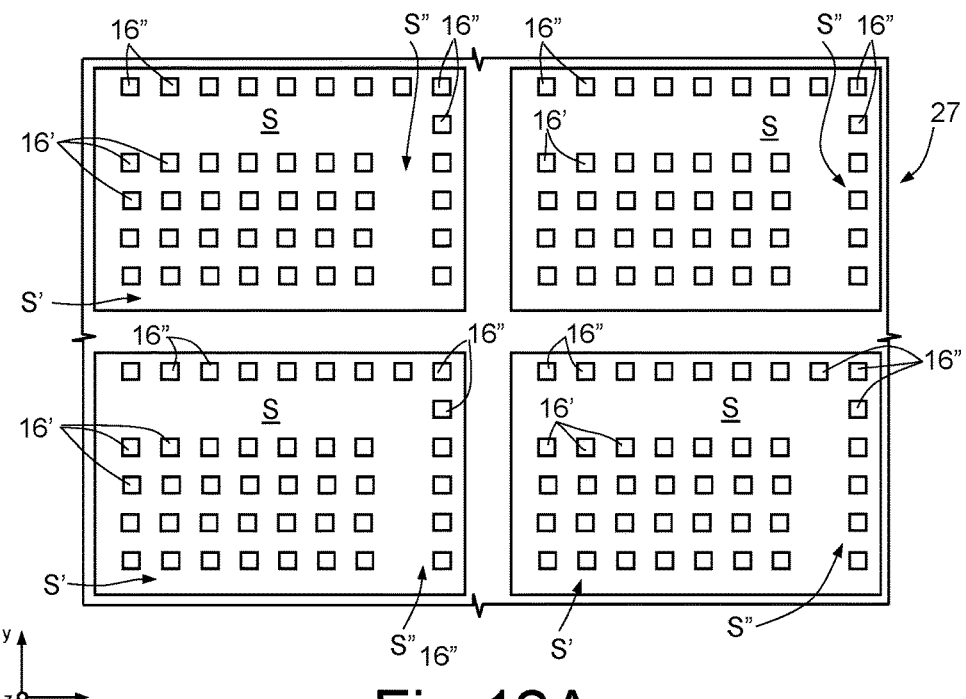
FIG. 12a is a schematic top plan view of a portion of a wafer of semiconductor material.

With initial reference to FIG. 12a, a possible embodiment of a method for stacking the dies 12 within the package 32 is discussed.

In the solution illustrated, in a portion 27 of a wafer of semiconductor material a plurality of integrated circuits 18 and the associated electrical coupling elements (for example, the internal through silicon vias 11, the conductive paths 15, 21, 22, the contact pads 16, including the contact pads 16', 16" of the first and second pluralities) have been previously provided. The integrated circuits 18 may advantageously be electrically tested prior to stacking of the dies 12.

Figure 12B:
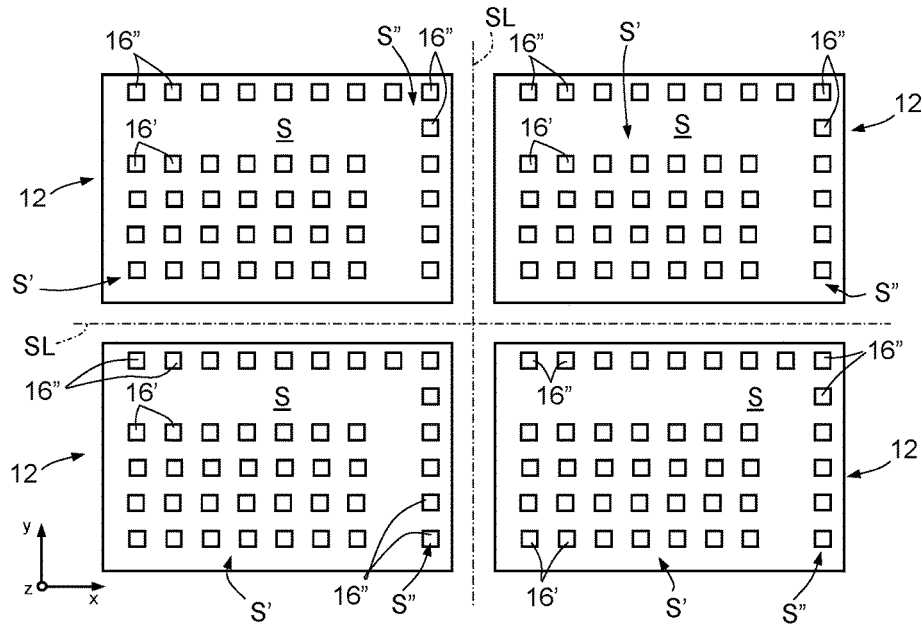
FIG. 12b is a schematic top plan view of the portion of wafer of FIG. 12a, subjected to a sawing operation.

As illustrated in FIG. 12b, the wafer portion 27 is then subjected to a sawing operation along scribe lines SL, to form the bottom dies 12 in the stacked structure.

These dies 12 may advantageously be arranged on top of a so-called "stick foil" 54 (illustrated in FIG. 12d), for the remaining machining steps, possibly arranging the same dies 12 separated at an appropriate distance D' and D" (see FIG. 12c) from one another, as a function also of the number of dies that will have to be stacked in an oblique direction, as discussed previously.

Figure 12C:
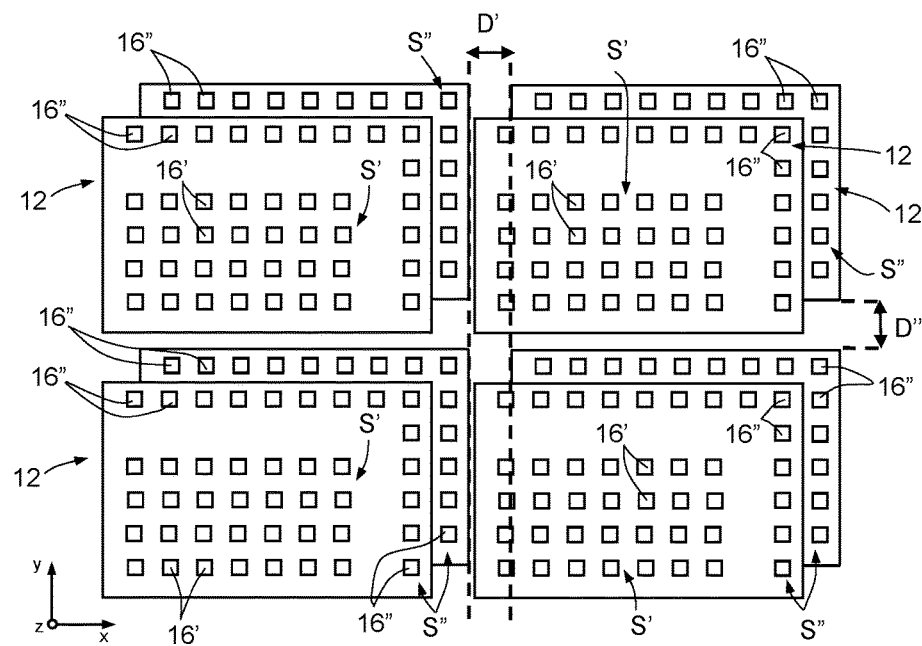
FIG. 12c is a schematic top plan view of the portions of wafer obtained in FIG. 12b, on which dies have been stacked.
Figure 12D:
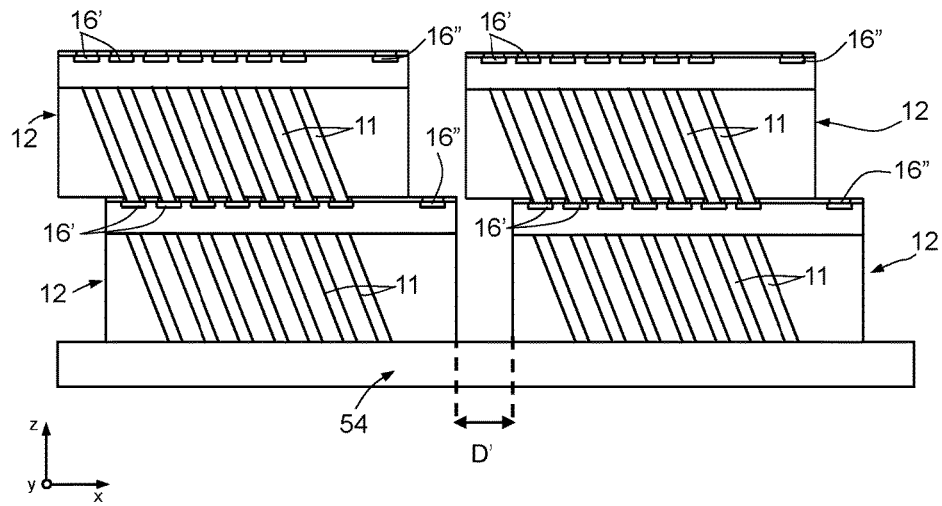
FIG. 12d is a schematic cross-sectional view of the portion of wafer of FIG. 12c.

As illustrated in FIG. 12c and in the corresponding cross-sectional view of FIG. 12d, the method then envisages that a plurality of dies 12 are stacked on top of the dies 12 previously obtained by the operation of sawing of the wafer portion 27.

In particular, as discussed in detail previously, the overlying dies 12 are stacked so as to cover the first portion S' of the top surface S of the underlying die 12 and the corresponding contact pads 16', and for leaving instead exposed the second portion S" and the corresponding contact pads 16" of the second plurality.

In particular, in this step, the bottom ends 11a of the internal through silicon vias 11 of the dies 12, arranged on top in the pairs of stacked dies, are placed within the openings 19, in electrical contact with the contact pads 16' of the first plurality of contact pads 16 of the dies 12 arranged at the bottom.

Once the step of stacking of the dies 12 (only two in this example) and their testing is completed, it is possible to proceed to detaching the single stacked structure from the stick foil 54, and then mounting it on the supporting layer 4, possibly adding connection wires 30 for repairing any possible faults in the internal through silicon vias 11; the method ends with the step of moulding and of final testing of the overall system.

Figure 13A:
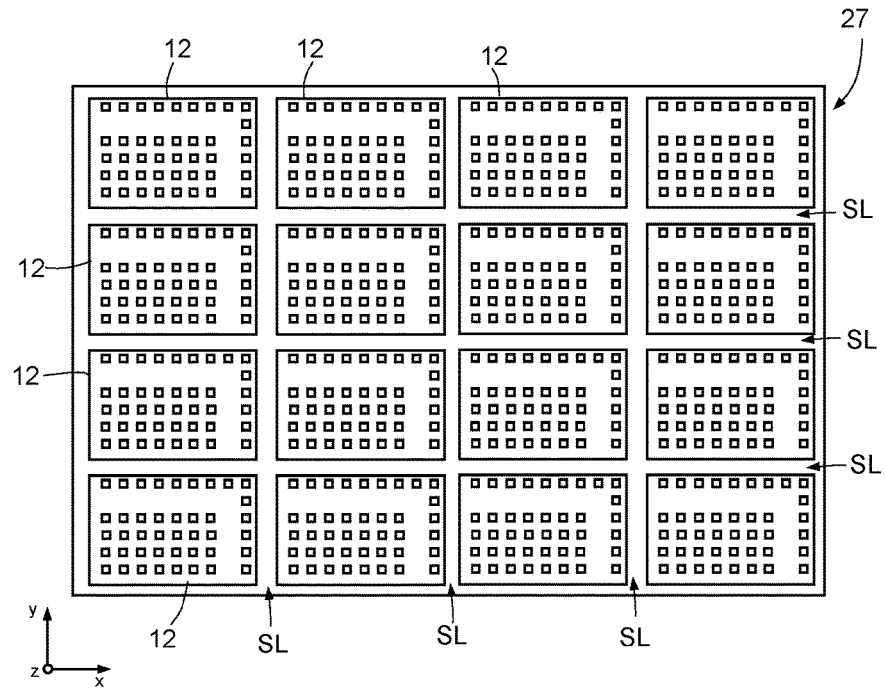
FIG. 13a is a schematic top plan view of a portion of wafer of semiconductor material, according to a further embodiment.
Figure 13B:
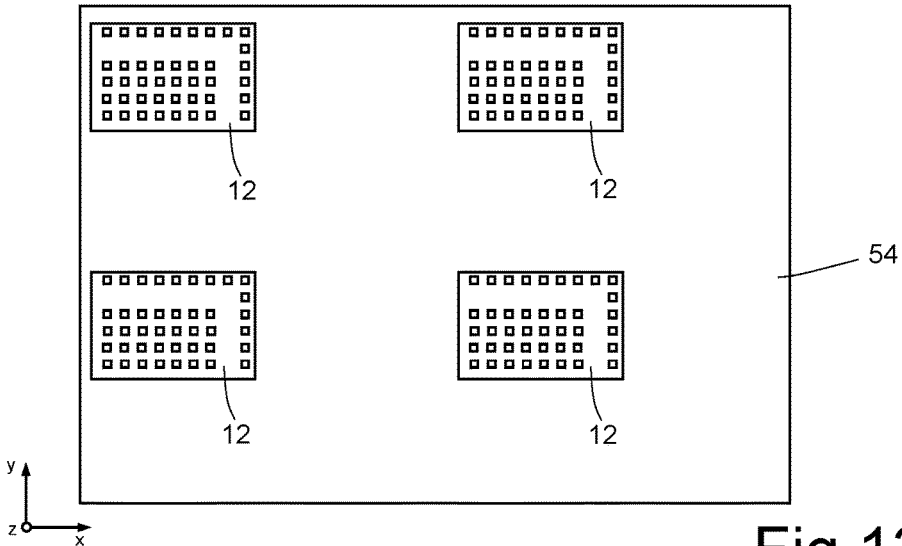
FIG. 13b is a schematic top plan view of the portion of wafer of FIG. 12a, subjected to an operation of sawing and separation of the resulting dies.

In another possible embodiment of the process of stacking of the dies 12 illustrated in FIGS. 13a and 13b, particularly useful in the case where the number of dies 12 is large, once the operation of sawing of the wafer portion 27 has been carried out, the dies 12 may be appropriately redistributed on the stick foil 54, for increasing the horizontal space for stacking of the overlying dies 12 in the stacked structure. For instance, the dies 12 may be removed from the stick foil used for the sawing operation, and attached on a further stick foil for increasing the distance between them.

Figure 13C:
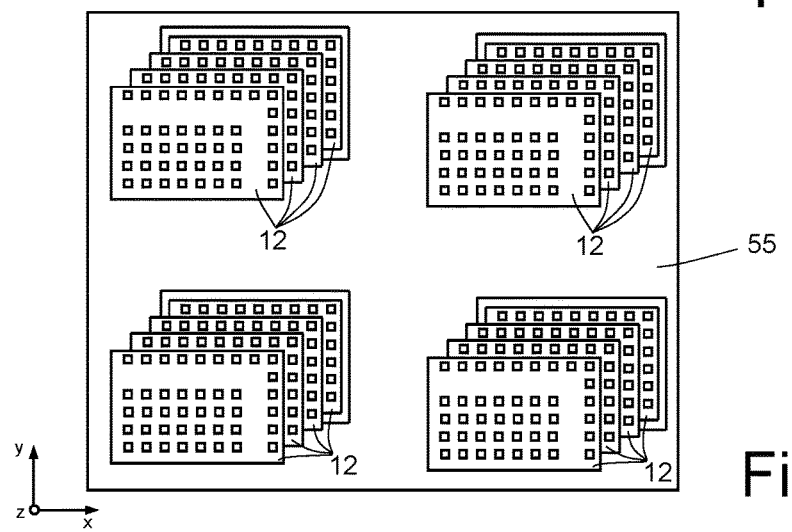
FIG. 13c is a schematic top plan view of the portions of wafer of FIG. 13b, on which a certain number of dies have been stacked.

As indicated in FIG. 13c, in order to increase the stiffness of the stacked structure, the dies 12 on the stick foil 54 may be embedded in a mould compound 55, for example a resin or a polymer, leaving the top surface S exposed for enabling subsequent stacking of the other dies 12.

Figure 13D:
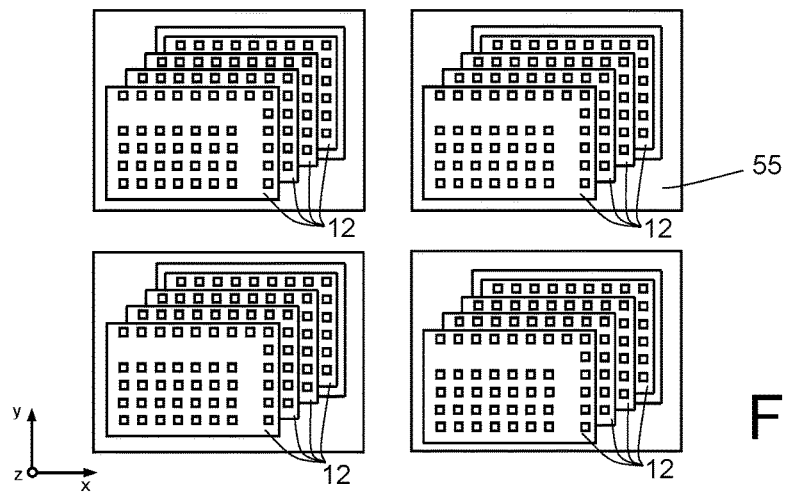
FIG. 13d is a schematic top plan view of the portion of wafer of FIG. 13c, subjected to further cutting.

Once all the various dies 12 have been stacked, it is possible to proceed to sawing the resulting structure, as illustrated in FIG. 13*d*.

Each resulting stacked-die structure 12 may subsequently be arranged on the supporting layer 4 (possibly with interposition of the interposer layer 36). The possible electrical connection wires 30 may further be provided, for repair of possible internal through silicon vias 11 evaluated as non-functioning during the testing operation. Finally, the insulating coating 10 may be formed and possible further manufacturing steps may be carried out to complete the package 32 and the overall system.

In a variant not illustrated, the stick foil 54 in FIG. 13*b* may be replaced by the supporting layer 4 on which the bottom dies 12 are assembled, and then the further dies 12 may be stacked. In this way, it is possible to avoid the use of the mould compound 55 and then proceed to cutting of the supporting layer 4 in a way similar to what has been illustrated in FIG. 13*d*.

Figure 14A:
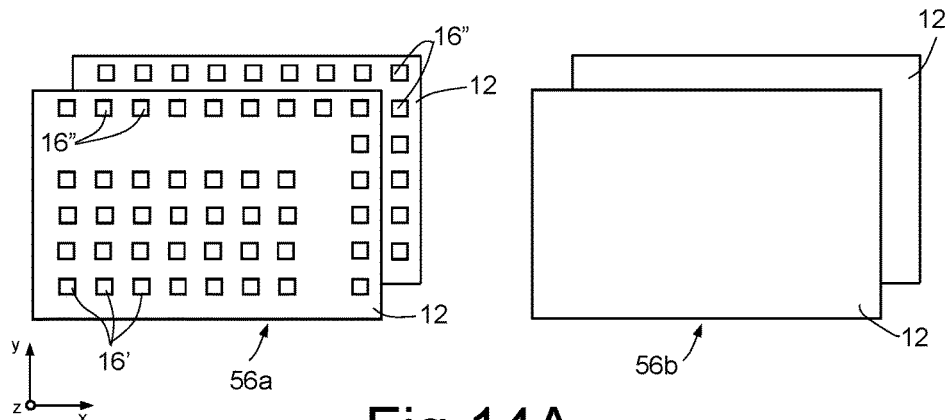
FIGS. 14a and 14b are schematic top plan views of an electrical coupling of pairs of stacked dies, according to a further aspect of the present solution.
Figure 14B:
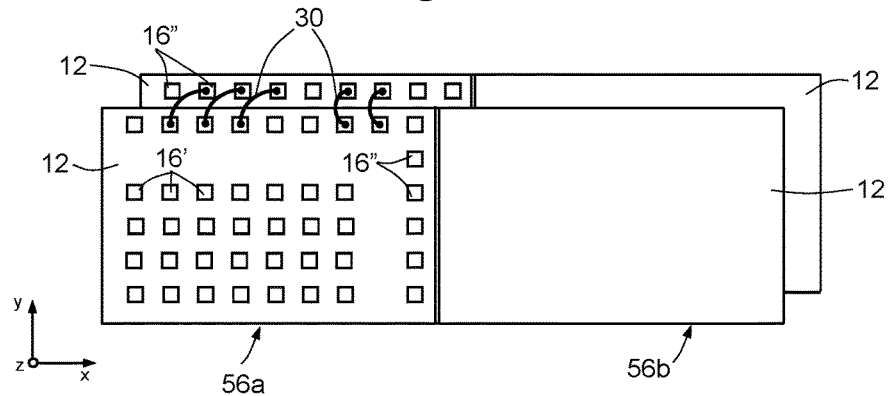
Figure 14C:
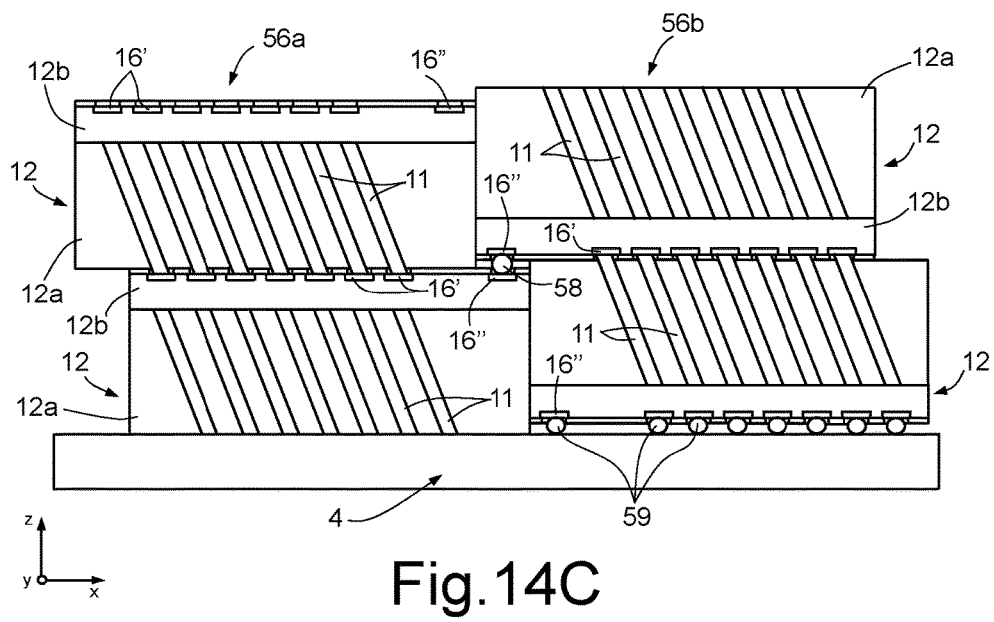
FIG. 14c is a schematic cross-sectional view of the electrical coupling of FIG. 14b encapsulated in a package.

With reference to FIGS. 14*a*-14*c*, a further embodiment of the present solution is now disclosed.

In particular, this embodiment envisages the possibility of forming stacked structures of dies 12, complementary to one another, which are connected together through at least one part of the contact pads 16" of the second plurality of contact pads 16 of the various dies 12.

In detail, FIGS. 14*a*-14*c* show two stacked structures complementary to one another, designated by 56*a* and 56*b*, by way of example including two respective dies 12 stacked on one another (the number of dies 12 may, however, be any).

In particular, as illustrated in FIG. 14*a*, the stacked structures 56*a* and 56*b* are altogether equivalent to one another and are arranged alongside one another horizontally, with the second one arranged upside down with respect to the first along the vertical axis z.

As illustrated in FIG. 14*c*, some of the contact pads 16" of the die 12 arranged at the bottom in the first stacked structure 56*a* are electrically and mechanically coupled by coupling elements 58 (of the bump type), for example constituted by solder paste, with corresponding contact pads 16" of the die 12 arranged on top in the second stacked structure 56*b*.

As illustrated in FIG. 14*b*, further contact pads 16" of the dies 12 of each stacked structure 56*a*, 56*b* may again be used, in a way similar to what has been discussed previously, for mutual connection by the electrical connection wires 30, in order to repair faulty connections initially provided by corresponding internal through silicon vias 11.

For instance, the contact pads 16" aligned along a first side, for example along the first horizontal axis x, may be used for guaranteeing redundancy of the connections and repair of faults by the electrical connection wires 30, whereas different contact pads 16" aligned along the second side, for example along the second horizontal axis y, may be used for coupling of the complementary stacked structures 56*a*, 56*b*.

As illustrated in FIG. 14*c*, the electrical connection of the die 12 arranged at the bottom in the second stacked structure 56*b* with the base layer 4 may be provided by further coupling elements 59 (of the bump type), connected between the contact pads 16 of the die 12 and the through silicon vias 9 (or further and different conductive paths, not illustrated, provided in the same base layer 4).

Furthermore, the electrical connection between the die 12 arranged at the bottom in the first stacked structure 56*a* and the base layer 4 is provided by the internal through silicon vias 11 of the same die 12.

Figure 15:
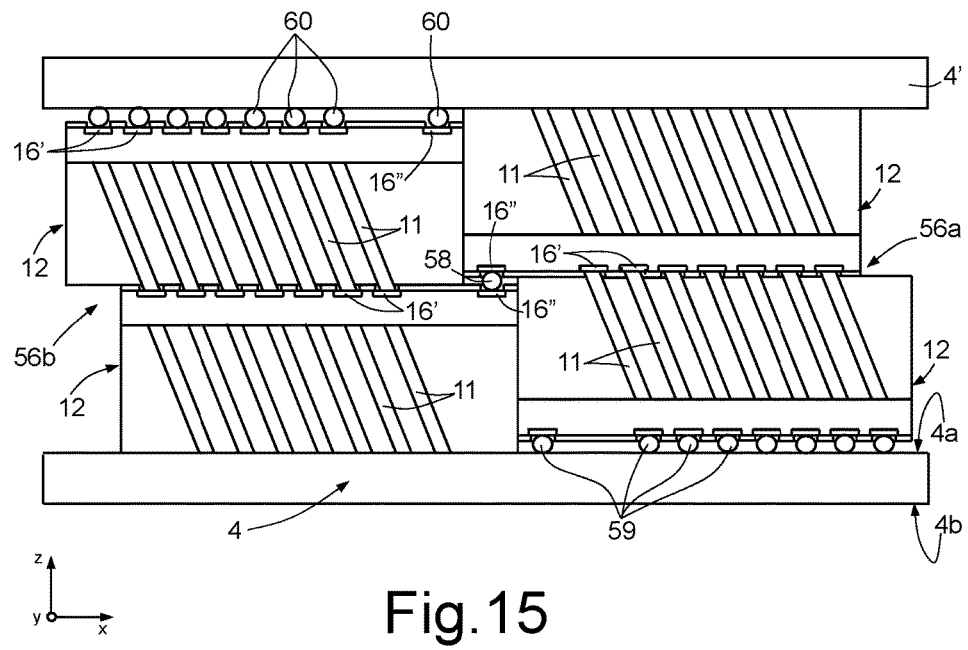
FIG. 15 is a schematic cross-sectional view of the electrical coupling of FIG. 14c, encapsulated in another exemplary package.

As illustrated in FIG. 15, the package 32 may comprises a further base layer 4', arranged at the top on the stacked structures 56*a*, 56*b*, on the opposite side with respect to the base layer 4 along the vertical axis z.

In particular, the die 12 arranged on top in the first stacked structure 56*a* may in this case be electrically connected with the aforesaid further base layer 4' by further coupling elements 60 (of the bump type), connected between the contact pads 16 of the same die 12 and further external through silicon vias (or conductive paths, not illustrated, provided in the same further base layer 4').

Furthermore, the electrical connection between the die 12 arranged on top in the second stacked structure 56*b* and the further base layer 4' is provided by the internal through silicon vias 11 of the same die 12.

This embodiment thus envisages the presence both of vertical (or, as in the example, oblique) electrical connections between dies 12 of a same stacked structure 56*a*, 56*b*, by the respective internal through silicon vias 11, and horizontal electrical connections between dies 12 belonging to different stacked structures 56*a*, 56*b*, in the example by the coupling elements 58.

In addition, a part of the contact pads 16" of the dies 12 of each stacked structure 56*a*, 56*b* may be used for repairing possible faulty internal through silicon vias 11 (thus obtaining a redundancy in the electrical connections), whereas a different part of the aforesaid contact pads 16" may be used for electrically connecting together the stacked structures 56*a*, 56*b* within the package 32.

The base layer 4 and the further base layer 4' may possibly have openings or recesses for accommodating the electrical connection wires 30 between the contact pads 16" used for repairing possible faulty internal through silicon vias 11 in the various stacked structures 56*a*, 56*b*.

Figure 16:
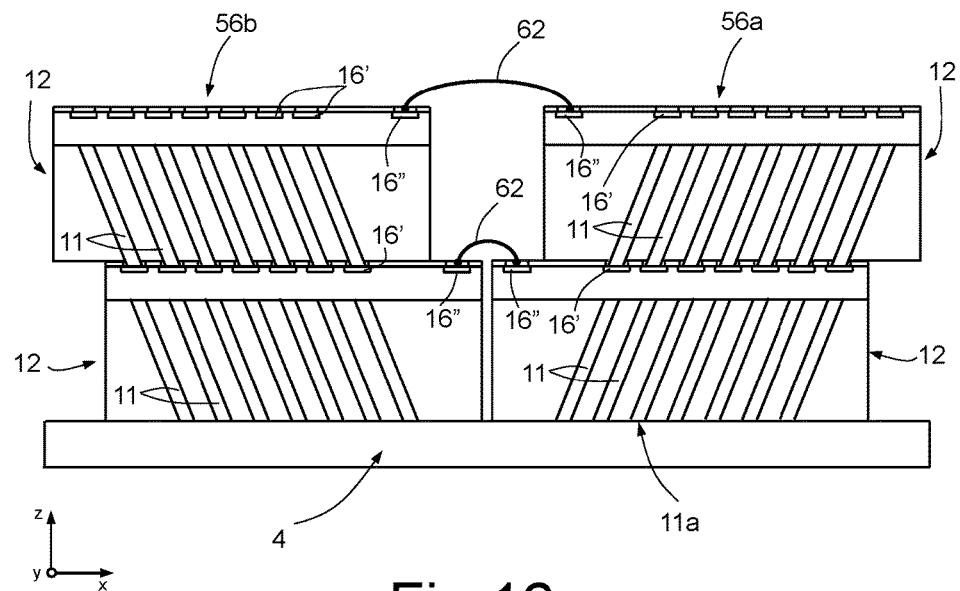
FIG. 16 is a schematic cross-sectional view of an electrical coupling of pairs of stacked dies, according to yet a further aspect of the present solution.

As illustrated in FIG. 16, a further embodiment of the present solution envisages once again the possibility of coupling horizontally together in the package 32 two (or more) stacked structures 56*a*, 56*b*, complementary to one another.

In this case, the stacked structures 56*a*, 56*b* are arranged alongside one another on the base layer 4 in a specular way instead of being arranged upside down with respect to one another (as in the embodiment illustrated previously).

A part of the contact pads 16" of the dies 12 of each stacked structure 56*a*, 56*b* is used for electrical connection between the stacked structures 56*a*, 56*b*, in this case by further electrical connection wires 62, arranged horizontally between the stacked structures 56*a*, 56*b* to electrically connect together the aforesaid contact pads 16".

The advantages of the solution proposed emerge clearly from the foregoing description.

In any case, it is emphasized once again that the solution described enables containment of the overall dimensions of the resulting packaging 32, at the same time ensuring complete testability of the stacked dies 12, during the electrical testing operations that may be carried out during the intermediate steps and the final step of a corresponding manufacturing process, or else at periodic intervals during operation of the electronic system in which the same package 32 is used.

Furthermore, the solution described implements a strategy of redundancy in the electrical connections between the various dies 12 of the stacked structures. Possible internal through silicon vias 11 that may prove to be faulty during an electrical testing step may in fact be replaced by electrical connections provided by electrical connection wires 30 between contact pads 16" of the same dies 12.

In other words, advantageously, the contact pads 16" may be used either during electrical testing for testing operation of the integrated circuits 18 and/or of the internal through silicon vias 11 of the various dies 12 or subsequently for implementing the redundancy of the electrical connections between the same dies 12.

This solution thus enables considerable reduction of the defectiveness of the resulting electronic systems and further enables drastic reduction of rejects during the manufacturing process.

Furthermore, the solution described offers advantageous possibilities of horizontal connection between various stacked structures 56a, 56b formed by vertically stacked dies 12, enabling for example modular coupling structures to be obtained, generally further improving the characteristics of the package 32.

In general, it is advantageous to use a same package 32 in an electronic device, for example of the portable mobile communication type, such as a cellphone, a smartphone, a PDA (Personal Digital Assistant), or a digital audio player with voice-recording capacity, a photographic camera or a video camera, a controller for videogames, etc., or a wearable apparatus, such as a smartwatch or an electronic bracelet.

Finally, it is clear that modifications and variations may be made to what has been described and illustrated herein, without thereby departing from the scope of the present disclosure, as defined in the annexed claims.

In particular, it is emphasized once again that the number of dies 12 in each stacked structure 56a, 56b within the package 32 may be any, as likewise the number of stacked structures 56a, 56b electrically coupled together in a same package 32.

Figure 17A:
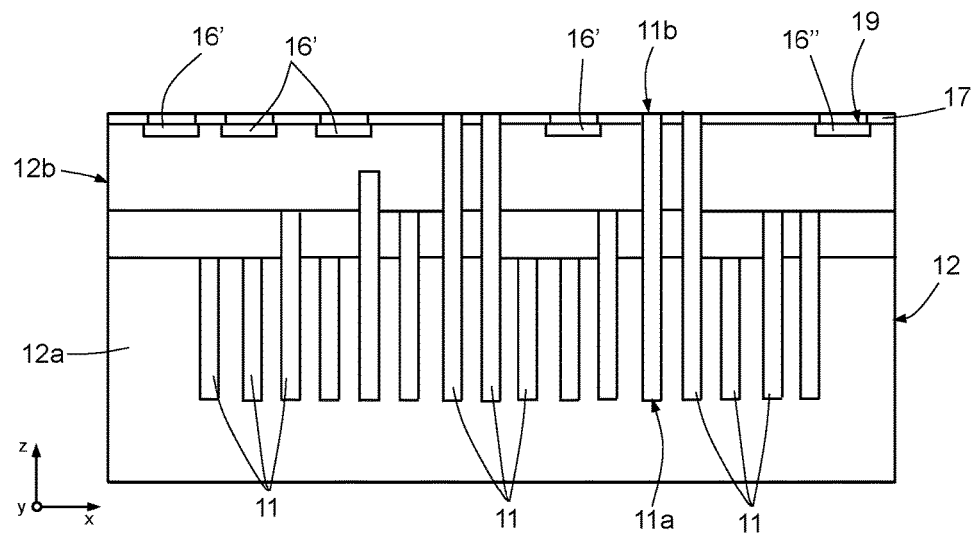
FIGS. 17a and 17b are schematic cross-sectional views of a die in further variants of the present solution.
Figure 17B:
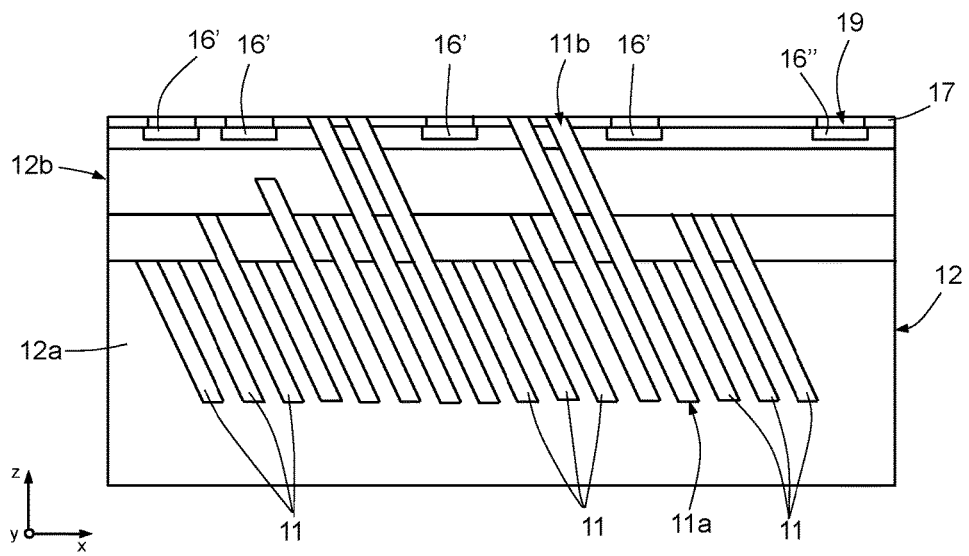

Furthermore, as illustrated in FIG. 17a (regarding a vertical configuration of the internal through silicon vias 11) and in FIG. 17b (regarding an oblique configuration of the internal through silicon vias 11), the internal through silicon vias 11 may have any of the following configurations (of a known type): the so-called "via-first" configuration, which envisages that the top end 11b of the internal through silicon vias 11 is arranged at the top surface of the substrate 12a of the die 12; the so-called "via-middle" configuration, which envisages that the top end 11b of the internal through silicon vias 11 is arranged within the multi-layer 12b of the same die 12; or else again the so-called "via-last" configuration, which envisages that the top end 11b of the internal through silicon vias 11 is arranged at the top surface of the multi-layer 12b of the die 12.

In addition, in a way alternative to what is illustrated schematically in FIG. 3, exploiting the staggered vertical stacking it is possible to obtain many other stacking structures.

For instance, FIG. 18 shows an example of stacking of dies 12 that in top plan view has a spiral shape, given that the staggering between the various dies 12 is no longer made in the same direction between one die 12 and the next stacked one as in FIG. 3, but the staggering direction changes from one die 12 to the next stacked one. Basically, in this case, the staggering angle a may be positive or negative (or, equivalently may change direction, clockwise or counterclockwise) with respect to the vertical axis z, between two or more of the dies 12 stacked on one another.

It is pointed out that this solution may advantageously contribute to further reducing the size of the resulting package 32.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a first stacked structure including a first plurality of semiconductor dies, each semiconductor die including a respective integrated circuit of a plurality of integrated circuits, and having a respective top surface which extends parallel to a horizontal plane, the semiconductor dies being stacked on one another in a vertical direction, transverse to the horizontal plane, and staggered in a first direction and in a second direction of a plane parallel to said horizontal plane, the first direction orthogonal to the second direction;
a first plurality of contact pads positioned at a first portion of the top surface of a lower die of the first plurality of semiconductor dies;
a second plurality of contact pads positioned at a second portion of the top surface of the lower die; said first portion being covered by an overlying die of the first plurality of semiconductor dies and said second portion being exposed and freely accessible from outside said first stacked structure; and
internal through silicon vias traversing a substrate of the overlying die and electrically coupled to at least some of the contact pads of the first plurality to set in electrical contact the lower and overlying dies in said first stacked structure.

2. The device according to claim 1, wherein at least some of the semiconductor dies of said first stacked structure are staggered with respect to one another by a non-zero staggering angle, positive or negative with respect to said vertical axis.

3. An electronic device, comprising:
a first stacked structure including a first plurality of semiconductor dies, each semiconductor die including a respective integrated circuit of a plurality of integrated circuits, and having a respective top surface which extends parallel to a horizontal plane, the semiconductor dies being stacked on one another in a vertical direction, transverse to the horizontal plane, and staggered parallel to said horizontal plane;
a first plurality of contact pads positioned at a first portion of the top surface of a lower die of the first plurality of semiconductor dies;
a second plurality of contact pads positioned at a second portion of the top surface of the lower die; said first portion being covered by an overlying die of the first plurality of semiconductor dies and said second portion being exposed and freely accessible from outside said first stacked structure; and
internal through silicon vias traversing a substrate of the overlying die and electrically coupled to at least some of the contact pads of the first plurality to set in electrical contact the lower and overlying dies in said first stacked structure, wherein at least some of the semiconductor dies of said first stacked structure are staggered with respect to one another by a non-zero staggering angle, positive or negative with respect to said vertical axis; and the internal through silicon vias of said overlying die are inclined by an angle of inclination with respect to said vertical axis.

4. The device according to claim 3, wherein said angle of inclination corresponds to said staggering angle.

5. The device according to claim 1, wherein at least some of the contact pads of said second plurality are electrically coupled to one of the integrated circuits and are designed to be contacted by probes for enabling execution of at least one electrical test.

6. The device according to claim 5, further comprising:
a contact pad on the overlying die;
an electrical connection wire that connects the contact pad on the overlying die with one of said second plurality of contact pads at the second portion of the lower die; and
first and second reconfigurable circuits of the lower and overlying dies, respectively, the first reconfigurable circuit being configured to define a first electrical path between the one of said second plurality of contact pads and a first end of a faulty internal through silicon via of the plurality of internal through silicon vias, in response to said at least one electrical test showing the faulty internal through silicon via to be faulty, and the second reconfigurable circuit being configured to define a second electrical path between the contact pad on the overlying die and a second end of the faulty internal through silicon via, in response to said at least one electrical test showing the faulty internal through silicon via to be faulty.

7. The device according to claim 1, further comprising:
a second stacked structure formed by a second plurality of semiconductor dies, stacked in said vertical direction in a staggered way parallel to said horizontal plane;
a contact pad on one of the semiconductor dies of the second plurality of semiconductor dies; and
an electrical connector that connects one of the contact pads of the second plurality of contact pads with the contact pad on the one of the semiconductor dies of the second plurality of semiconductor dies.

8. The device according to claim 7, wherein the electrical connector includes at least one of a contact bump and an electrical connection wire.

9. The device according to claim 1, wherein said top surface of the lower die is delimited in said horizontal plane by a perimeter; and wherein said contact pads of the second plurality of contact pads are arranged along a first side and a second side, which are adjacent to one another, of said perimeter.

10. A method, comprising:
manufacturing an electronic device , the manufacturing including:
providing a first stacked structure formed by a first plurality of semiconductor dies, each semiconductor die including a respective integrated circuit of a plurality of integrated circuits, and having a respective top surface, which extends parallel to a horizontal plane, the semiconductor dies being stacked on one another in a vertical direction, transverse to the horizontal plane, and staggered in a first direction and in a second direction of a plane parallel to said horizontal plane, the first direction orthogonal to the second direction;

providing a first plurality of contact pads at a first portion of said top surface of a lower die of the first plurality of semiconductor dies, a first plurality of contact pads providing, at a second portion of said top surface of the lower die, a second plurality of contact pads; said first portion being covered by an overlying die of the first plurality of semiconductor dies in said first stacked structure and said second portion being exposed and freely accessible from outside said first stacked structure; and electrically coupling at least some of the contact pads of said first plurality to internal through silicon vias traversing a substrate of the overlying die in said first stacked structure to set in electrical contact the lower and overlying dies in said first stacked structure.

11. The method according to claim 10, wherein providing the first stacked structure comprises stacking at least some of the semiconductor dies of said first stacked structure in a staggered way with respect to one another by a non-zero staggering angle, positive or negative with respect to said vertical axis.

12. The method according to claim 11, wherein the manufacturing includes providing the internal through silicon vias of said overlapping dies inclined by an angle of inclination with respect to said vertical axis.

13. The method according to claim 12, wherein said angle of inclination corresponds to said staggering angle.

14. A method, comprising:
manufacturing an electronic device , the manufacturing including:
providing a first stacked structure formed by a first plurality of semiconductor dies, each semiconductor die including a respective integrated circuit of a plurality of integrated circuits, and having a respective top surface, which extends parallel to a horizontal plane, the semiconductor dies being stacked on one another in a vertical direction, transverse to the horizontal plane, and staggered parallel to said horizontal plane;
providing a first plurality of contact pads at a first portion of said top surface of a lower die of the first plurality of semiconductor dies, a first plurality of contact pads
providing, at a second portion of said top surface of the lower die, a second plurality of contact pads; said first portion being covered by an overlying die of the first plurality of semiconductor dies in said first stacked structure and said second portion being exposed and freely accessible from outside said first stacked structure;
electrically coupling at least some of the contact pads of said first plurality to internal through silicon vias traversing a substrate of the overlying die in said first stacked structure to set in electrical contact the lower and overlying dies in said first stacked structure; and
electrically coupling at least some of the contact pads of said second plurality to one of the integrated circuits; and
carrying out at least one electrical test of said integrated circuit by probes that contact said at least some of the contact pads of said second plurality.

15. The method according to claim 14, further comprising:
reconfiguring first and second reconfigurable circuits of the lower and overlying dies, respectively, reconfiguring the first reconfigurable circuit including defining a first electrical path between one of said second plurality of contact pads and a first end of a faulty internal through silicon via of the plurality of internal through silicon vias, in response to said at least one electrical test showing the faulty internal through silicon via to be faulty, and reconfiguring the second reconfigurable circuit including defining a second electrical path between a contact pad on the overlying die and a second end of the faulty internal through silicon via, in response to said at least one electrical test showing the faulty internal through silicon via to be faulty; and providing an electrical connection wire that connects the contact pad on the overlying die with the one of said second plurality of contact pads of said second plurality of contact pads, wherein said electrical connection wire thereby provides an electrical connection between said lower and overlying dies.

16. The method according to claim 10, wherein the manufacturing includes:

forming a second stacked structure formed by a second plurality of semiconductor dies stacked in said vertical direction in a staggered way parallel to said horizontal plane; and electrically coupling together the lower die of said first stacked structure with one of the semiconductor dies of said second stacked structure using one of the contact pads of the second plurality of contact pads.

17. The method according to claim 16, wherein the manufacturing includes forming at least one of a contact bump and an electrical connection wire that electrically connects together said one of the contact pads of the second plurality of contact pads with a contact pad on the one of the semiconductor dies of said second stacked structure.

18. A method, comprising:

electrically testing an electronic device that includes:
a first stacked structure including a first plurality of semiconductor dies, each semiconductor die including a respective integrated circuit of a plurality of integrated circuits, and having a respective top surface which extends parallel to a horizontal plane, the semiconductor dies being stacked on one another in a vertical direction, transverse to the horizontal plane, and staggered parallel to said horizontal plane;
a first plurality of contact pads positioned at a first portion of the top surface of a lower die of the first plurality of semiconductor dies;
a second plurality of contact pads positioned at a second portion of the top surface of the lower die; said first portion being covered by an overlying die of the first plurality of semiconductor dies and said second portion being exposed and freely accessible from outside said first stacked structure;
internal through silicon vias traversing a substrate of the overlying die and electrically coupled to at least some of the contact pads of the first plurality to set in electrical contact the lower and overlying dies in said first stacked structure; and
an integrated circuit electrically coupled to at least some of the contact pads of the second plurality of contact pads, wherein the electrically testing includes:
contacting said at least some of the contact pads of the second plurality of contact pads with a plurality of probes; and
executing at least one electrical test while the probes contact said at least some of the contact pads of the second plurality of contact pads.

19. The method according to claim 18, further comprising:

issuing a first control signal to a first reconfigurable circuit of said lower die, the first control signal causing the first reconfigurable circuit to define a first electrical path between one of the contact pads of said plurality of contact pads and a first end of a faulty internal through silicon via in response to said at least one electrical test showing the faulty internal through silicon via to be faulty;

issuing a second control signal to a second reconfigurable circuit of said overlying die, the second control signal causing the second reconfigurable circuit to define a second electrical path between a contact pad on the overlying die and a second end of the faulty internal through silicon via in response to said at least one electrical test showing the faulty internal through silicon via to be faulty; and providing an electrical connection wire that connects together contact pad on the overlying die and the one of the contact pads of said second plurality of contact pads.

20. A device, comprising:

a first stacked structure including:
a first semiconductor die including a first integrated circuit, the first semiconductor die having a first surface and a second surface opposite the first surface, the first semiconductor die including:
a first plurality of contact pads positioned at a first portion of the first surface of the first semiconductor die, the first plurality of contact pads including a first pad, second pad, and a third pad;
a second plurality of contact pads positioned at a second portion of the first surface of the first semiconductor die; and
a second semiconductor die including a second integrated circuit, the second semiconductor die having a first surface and a second surface opposite the first surface, the second surface of the second semiconductor die being on the first surface of the first semiconductor die such that the first plurality of contact pads are not covered by the second semiconductor die and the second plurality of contact pads are covered by the second semiconductor die, the semiconductor dies being stacked on one another in a vertical direction, transverse to a horizontal plane parallel to the first surface of the first semiconductor die, and staggered in a first direction and in a second direction of a plane parallel to said horizontal plane, the first direction orthogonal to the second direction, the second semiconductor die including:
a plurality of internal through silicon vias electrically coupled to the second integrated circuit, traversing a substrate of the second semiconductor die, and electrically coupled to the second plurality of contact pads.

21. The device according to claim 20, wherein the first semiconductor die and the second semiconductor die have similar exterior dimensions.

22. The device according to claim 20, wherein the first plurality of contact pads are electrically coupled to the first integrated circuit and are configured to be contacted by first, second, and third probes at the first, second, and third pads, respectively, for enabling execution of at least one electrical test.

23. The device according to claim 20, further comprising:
an electrical connector that connects one of the first plurality contact pads to a contact pad on the first surface of the second semiconductor die.

\* \* \* \* \*